United States Patent
Suzuki et al.

(10) Patent No.: US 11,031,932 B2
(45) Date of Patent: Jun. 8, 2021

(54) POWER MODULE

(71) Applicant: SHINDENGEN ELECTRIC MANUFACTURING CO., LTD., Tokyo (JP)

(72) Inventors: Kenichi Suzuki, Saitama (JP); Wataru Miyazawa, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 16/955,765

(22) PCT Filed: Dec. 22, 2017

(86) PCT No.: PCT/JP2017/046229
§ 371 (c)(1),
(2) Date: Jun. 18, 2020

(87) PCT Pub. No.: WO2019/123656
PCT Pub. Date: Jun. 27, 2019

(65) Prior Publication Data
US 2021/0075416 A1    Mar. 11, 2021

(51) Int. Cl.
*H03K 17/14*    (2006.01)
*H03K 17/30*    (2006.01)

(52) U.S. Cl.
CPC ......... *H03K 17/145* (2013.01); *H03K 17/302* (2013.01)

(58) Field of Classification Search
CPC ........................... H03K 17/145; H03K 17/302
USPC ....................................................... 327/378
See application file for complete search history.

(56) References Cited

U.S. PATENT DOCUMENTS

| | | | |
|---|---|---|---|
| 2013/0147525 A1 | 6/2013 | Takagiwa | |
| 2015/0358013 A1* | 12/2015 | Sakai | H03K 17/161 327/109 |
| 2016/0006429 A1* | 1/2016 | Mori | H02M 1/088 323/312 |

FOREIGN PATENT DOCUMENTS

| | | |
|---|---|---|
| JP | 201515794 A | 1/2015 |
| JP | 2016149632 A | 8/2016 |
| WO | 2012153459 A1 | 11/2012 |
| WO | 2014123046 A1 | 8/2014 |

OTHER PUBLICATIONS

International Search Report in PCT/JP2017/046229, dated Mar. 6, 2018. 2pp.

* cited by examiner

*Primary Examiner* — Tomi Skibinski
(74) *Attorney, Agent, or Firm* — Hauptman Ham, LLP

(57) ABSTRACT

A power module includes a switching element, a temperature detection part which detects an operation temperature T of the switching element, a control electrode voltage control part which controls a control electrode voltage based on a threshold voltage Vth during an operation of the switching element which is calculated based on information including the operation temperature T of the switching element detected by the temperature detection part, and a switching speed control part which controls a switching speed of the switching element based on the operation temperature T of the switching element detected by the temperature detection part.

25 Claims, 10 Drawing Sheets ated temperature $T_0$ of the switching element when
POWER MODULE

RELATED APPLICATION

The present Application is a National phase of International Application number PCT/JP2017/046229, filed Dec. 22, 2017.

TECHNICAL FIELD

The present invention relates to a power module.

BACKGROUND ART

Conventionally, there has been known a power module which controls an ON/OFF operation of a switching element (see patent document 1, for example).

As shown in FIG. 12, a conventional power module 900 includes: a switching element 800 having a first electrode, a second electrode, and a gate electrode; and a gate voltage control part 920 which controls a gate voltage so as to control an ON/OFF operation of the switching element 800.

According to the conventional power nodule 900, an ON/OFF operation of the switching element 800 can be controlled by controlling a gate voltage using the gate voltage control part 920.

PRIOR ART DOCUMENT

Patent Document

Patent document 1: WO/2012/153459

SUMMARY OF INVENTION

Problem to be Solved by the Invention

FIG. 13 is a schematic graph showing a switching operation waveforms of a conventional power module. In FIG. 13, symbol tr_max indicates a maximum value of a turn-on time tr, symbol tr_typ indicates a reference value of the turn-on time tr, symbol tr_min indicates a minimum value of the turn-on time tr, symbol tf_max indicates a maximum value of a turn-off time tf, symbol tf_typ indicates a reference value of the turn-off time tf, symbol tf_min indicates a minimum value of the turn-off time tf, symbol SWloss_max indicates a switching loss when the turn-on time tr takes a maximum value (worst value), symbol SWloss_typ indicates a switching less when the turn-on time tr takes a reference value, symbol SWloss_min indicates a switching loss when the turn-on time tr takes a minimum value, symbol Vdsg_max indicates a surge voltage when the turn-on time tr takes a maximum value, symbol Vdsg_typ indicates a surge voltage when the turn-on time tr takes a reference value, and symbol Vdsg_min indicates a surge voltage when the turn-on time tr takes a reference value.

Recently, there has been a demand for a power module which can reduce a switching loss, and can reduce a change in total loss based on temperature.

As a method for reducing a switching loss, a method is considered where a switching loss is reduced by shortening a turn-on period and a turn-off period by applying a gate voltage which slightly exceeds a threshold voltage to a gate electrode (see FIG. 8B). However, the threshold voltage Vth during an operation changes from an initial threshold voltage $Vth_0$ caused by a fact that an operation temperature T of the switching element during an operation becomes higher than an initial temperature $T_0$ of the switching element when an initial threshold voltage (a threshold voltage at the time of shipping) is measured (see FIG. 7). Accordingly, it is difficult to shorten a turn-on period and a turn-off period by applying a voltage which slightly exceeds the threshold voltage Vth during the operation to a gate electrode thus giving rise to a drawback that it is difficult to reduce a switching loss.

Further, the method of reducing a switching loss has the following drawbacks (a) and (b) conventionally.

(a) In general, on a data sheet of an electric and thermal characteristic of a switching element, only reference values of a turn-on time tr and a turn-off time tf are described, and reference values of a maximum value MAX and a minimum value MIN set in designing an apparatus are not described. Accordingly, there exists a drawback that worst designing of a module cannot be tried and hence, worst values of a switching loss and a voltage surge cannot be obtained.

Even in a case where a maximum values MAX (tr_max, tf_max) and a minimum values MIN (tr_min, tf_min) of the turn-on time tr and the turn-off time tf are used as references, due to irregularities in the manufacture of the switching element, in general, the maximum values MAX/the minimum values MIN fall within a range of −50%/100% with respect to the reference values (see FIG. 13). In designing a module, when such values are used directly, a worst value of the switching loss (SWloss_max in FIG. 13) becomes twice as large as the reference value (SWloss_typ in FIG. 13) and hence, the heat radiation twice as large as the heat radiation at the reference value must be estimated in designing the heat radiation.

Also, with respect to the minimum values MIN in the turn-on period tr/turn-off period tf, a worst value of a surge voltage Vdsg (Vdsg_max in FIG. 13) generated by parasitic inductances Ld, Ls becomes approximately twice as large as a reference value (Vdsg_typ in FIG. 13) and hence, there is a concern that a voltage of the switching element exceeds a rated value or an electro-magnetic interference noise (EMI noise) is worsened.

(b) An ON resistance Ron when a switching element is turned-on (during a conductive operation) has a characteristic where the ON resistance Ron is increased as an operation temperature of the switching element is increased due to an ON/OFF operation or the like, and the ON resistance Ron is decreased when the operation temperature is lowered. Accordingly, when an operation temperature is increased due to an ON/OFF operation of the switching element, a module loss (that is, a conduction loss) is increased and hence, a total loss which is a sum of the switching loss and the conduction loss is increased.

To overcome the above-mentioned drawbacks (a) and (b), inventors of the present invention have invented a power module (a power module relating to a patent application prior to this application, not shown in the drawings) which is capable of reducing a change in total loss based on temperature by controlling a switching speed based on an operation temperature of a switching element, and has already made a patent application on such an invention as JP 2016-221044 A.

However, the power module according to the prior application was not made on a premise that a voltage which slightly exceeds a threshold voltage during an operation is applied to a gate voltage and hence, it is difficult to properly adjust switching times thus giving rise to a drawback that it is difficult to acquire the further reduction of a change in total loss based on temperature.

The present invention has been made in view of the above-mentioned circumstances, and it is an object of the present invention to provide a power module which can reduce a switching loss of a switching element, and can reduce a change in total loss based on temperature.

Solution to Problem

[1] According to the present invention, there is provided a power module which includes a switching element having a first electrode, a second electrode, and a control electrode; a temperature detection part which detects an operation temperature of the switching element; a control electrode voltage control part which controls a control electrode voltage based on a threshold voltage during an operation of the switching element which is calculated based on information including the operation temperature of the switching element detected by the temperature detection part; and a switching speed control part which controls a switching speed of the switching element based on the operation temperature of the switching element detected by the temperature detection part.

[2] In the power module according to the present invention, it is preferable that the power module further include: a memory part which stores information including an initial threshold voltage of the switching element and an initial temperature of the switching element when the initial threshold voltage is measured and information relating to a temperature characteristic of a threshold voltage in the switching element; and a threshold voltage calculation part which calculates a threshold voltage during an operation of the switching element based on information including the operation temperature of the switching element which is detected by the temperature detection part, an initial threshold voltage of the switching element, and an initial temperature of the switching element when the initial threshold voltage is measured, and information relating to a temperature characteristic of a threshold voltage in the switching element, wherein the control electrode voltage control part, when the switching element is brought into an ON state, control a control electrode voltage based on a threshold voltage during the operation of the switching element which is calculated by the threshold voltage calculation part.

[3] In the power module according to the present invention, it is preferable that, assuming a temperature coefficient of a threshold voltage in the switching element as $\alpha$, a threshold voltage during the operation of the switching element as Vth, the initial threshold voltage as $Vth_0$, the operation temperature of the switching element detected by the temperature detection part as T, and an initial temperature of the switching element when the initial threshold voltage is measured as $T_0$, information relating to the temperature characteristic of the threshold voltage in the switching element be a characteristic equation which satisfies the relationship of $Vth=Vth_0-\alpha(T-T_0)$.

[4] In the power module according to the present invention, it is preferable that the power module further include a switching speed calculation part which calculates a control electrode current amount based on the operation temperature of the switching element detected by the temperature detection part, wherein the switching speed control part include: a first control drive current control part which controls a first control drive current flowing into the switching element based on the control electrode current amount which is calculated by the switching speed calculation part and the control electrode voltage which the control electrode voltage control part controls based on a threshold voltage during an operation of the switching element; and a second control drive current control part which controls a second control drive current flowing into a ground side from the switching element based on the control electrode current amount which is calculated by the switching speed calculation part and a control electrode voltage which the control electrode voltage control part controls based on a threshold voltage during the operation of the switching element.

[5] In the power module according to the present invention, it is preferable that the first control drive current control part allow a first control drive current corresponding to a first reference voltage which is calculated based on the control electrode current amount to flow toward the switching element, and the second control drive current control part allow a second control drive current corresponding to a second reference voltage which is calculated based on the control electrode current amount to flow toward a ground side from the switching element.

[6] In the power module according to the present invention, it is preferable that the first control drive current control part include: a first current mirror circuit of one stage or a plurality of stages into which the first control drive current flows, and a first error amplifier circuit which detects a first drive current at an input side of the first current mirror circuit and generates a first drive voltage corresponding to the first drive current, and changes the first drive current by making the first drive voltage follow the first reference voltage, and the second control drive current control part include: a second current mirror circuit, of one stage or a plurality of stages into which the second control drive current flows, and a second error amplifier circuit which detects a second drive current at an input side of the second current mirror circuit and generates a second drive voltage corresponding to the second drive current, and changes the second drive current by making the second drive voltage follow the second reference voltage.

[7] In the power module according to the present invention, it is preferable that the power module be a power module which performs an initial threshold voltage measurement mode where the initial threshold voltage of the switching element is measured, and a control mode where an ON/OFF operation of the switching element is controlled, and the power module further include: a threshold voltage measurement power source which supplies a threshold voltage measurement current to the first electrode of the switching element; a switching current detection part which detects a switching current which flows through the switching element; and an ON/OFF state determination part which determines an ON/OFF state of the switching element, and in the initial threshold voltage measurement mode, the control electrode voltage control part control the control electrode voltage such that the control electrode voltage is increased in a stepwise manner, the ON/OFF state determination part determine whether or not the switching element is turned on base on the switching current which is detected by the switching current detection part, and the memory part, when the ON/OFF state determination part determines that the switching element is brought into an ON state, store the operation temperature of the switching element, and store the control electrode voltage applied to the control electrode as the initial threshold voltage of the switching element.

[8] In the power module according to the present invention, it is preferable that the power module be a power module which further performs a temperature characteristic measurement mode where a temperature characteristic of a threshold voltage in the switching element is measured after the control mode is performed for a predetermined time, the power module further include a temperature characteristic calculation part which calculates a temperature characteristic of a threshold voltage in the switching element, wherein in the temperature characteristic measurement mode, the control electrode voltage control part control the control electrode voltage such that the control electrode voltage is increased in a stepwise manner, the ON/OFF state determination part determine whether or not the switching element is turned on based on the switching current which is detected by the switching current detection part, the memory part, when the ON/OFF state determination part determines that the switching element is brought into an ON state, store the operation temperature of the switching element, and store the control electrode voltage applied to the control electrode as a temperature characteristic measurement time threshold voltage of the switching element, and the temperature characteristic calculation part calculate a temperature characteristic of a threshold voltage in the switching element based on information including the initial threshold voltage, an initial temperature of the switching element when the initial threshold voltage is measured, the operation temperature of the switching element detected by the temperature detection part in the temperature characteristic measurement mode, and the temperature characteristic measurement time threshold voltage.

[9] In the power module according to the present invention, it is preferable that the power module be a power module which further performs a temperature characteristic measurement mode where a temperature characteristic of a threshold voltage in the switching element is measured after the control mode is performed for a predetermined time, the power module further include: a threshold voltage measurement power source which supplies a threshold voltage measurement current to the first electrode of the switching element; a switching current detection part which detects a switching current which flows through the switching element; an ON/OFF state determination part which determines an ON/OFF state of the switching element; and a temperature characteristic calculation part which calculates a temperature characteristic of a threshold voltage in the switching element, wherein in the temperature characteristic measurement mode, the control electrode voltage control part control the control electrode voltage such that the control electrode voltage is increased in a stepwise manner, the ON/OFF state determination part determine whether or not the switching element is turned on based on the switching current which is detected by the switching current detection part, the memory part, when the ON/OFF state determination part determines that the switching element is brought into an ON state, store the control electrode voltage applied to the control electrode as a temperature characteristic measurement time threshold voltage of the switching element, and the temperature characteristic calculation part calculate a temperature characteristic of a threshold voltage in the switching element based on information including the initial threshold voltage, an initial temperature of the switching element when the initial threshold voltage is measured, the operation temperature of the switching element detected by the temperature detection part in the temperature characteristic measurement mode, and the temperature characteristic measurement time threshold voltage.

[10] In the power module according to the present invention, it is preferable that the switching element be a MOSFET, an IGBT, or a HEMT.

[11] In the power module according to the present invention, it is preferable that the switching element be formed using a material which contains GaN, SiC, or $Ga_2O_3$.

Advantageous Effects of Invention

According to the power module of the present invention, the power module includes the control electrode voltage control part which controls a control electrode voltage based on a threshold voltage during an operation of the switching element which is calculated based on information including an operation temperature of the switching element. Accordingly, even when the threshold voltage during the operation changes from an initial threshold voltage due to a fact that the operation temperature of the switching element during the operation becomes higher than the initial temperature of the switching element when an initial threshold voltage is measured (see FIG. 7), it is possible to apply a voltage which slightly exceeds the threshold voltage during the operation to the gate electrode (see FIG. 8B). As a result, a turn-on period and a turn-off period can be shortened and hence, a switching loss of the switching element can be reduced.

Further, according to the power module of the present invention, the power module includes the switching speed control part which controls a switching speed based on an operation temperature of the switching element. Accordingly, even when the operation temperature is increased so that a module loss (conduction loss) is increased, a change in total loss (a sum of a switching loss and a conduction loss) based on a temperature can be reduced by adjusting (increasing) the switching speed. The power module of the present invention further includes the control electrode voltage control part which controls a control electrode voltage based on a threshold voltage during an operation of the switching element calculated based on information including the operation temperature of the switching element. Accordingly, a switching time can be more properly adjusted by taking into account a turn-on period and a turn-off period which are shortened due to applying of a voltage which slightly exceeds a threshold voltage during the operation of the switching element to the gate electrode. As a result, a change in total loss based on temperature can be further reduced.

BRIEF DESCRIPTION OF DRAWINGS

FIG. 8A is the schematic view of the graph indicating a change with time of the gate-source voltage Vgs when the gate voltage is applied to the gate electrode in a power module according to a comparison example, and FIG. 8B is the schematic view of the graph indicating the change with time of the gate-source voltage when the gate voltage which slightly exceeds the threshold voltage is applied to the gate electrode in the power module 1 according to the embodiment 1.

DESCRIPTION OF EMBODIMENTS

Hereinafter, a power module according to the present invention is described based on embodiments shown in drawings. The respective drawings are schematic views, and do not always strictly reflect the actual circuit configuration and actual graphs.

Embodiment 1

1. Configuration of Power Module 1 According to Embodiment 1

Figure 1:
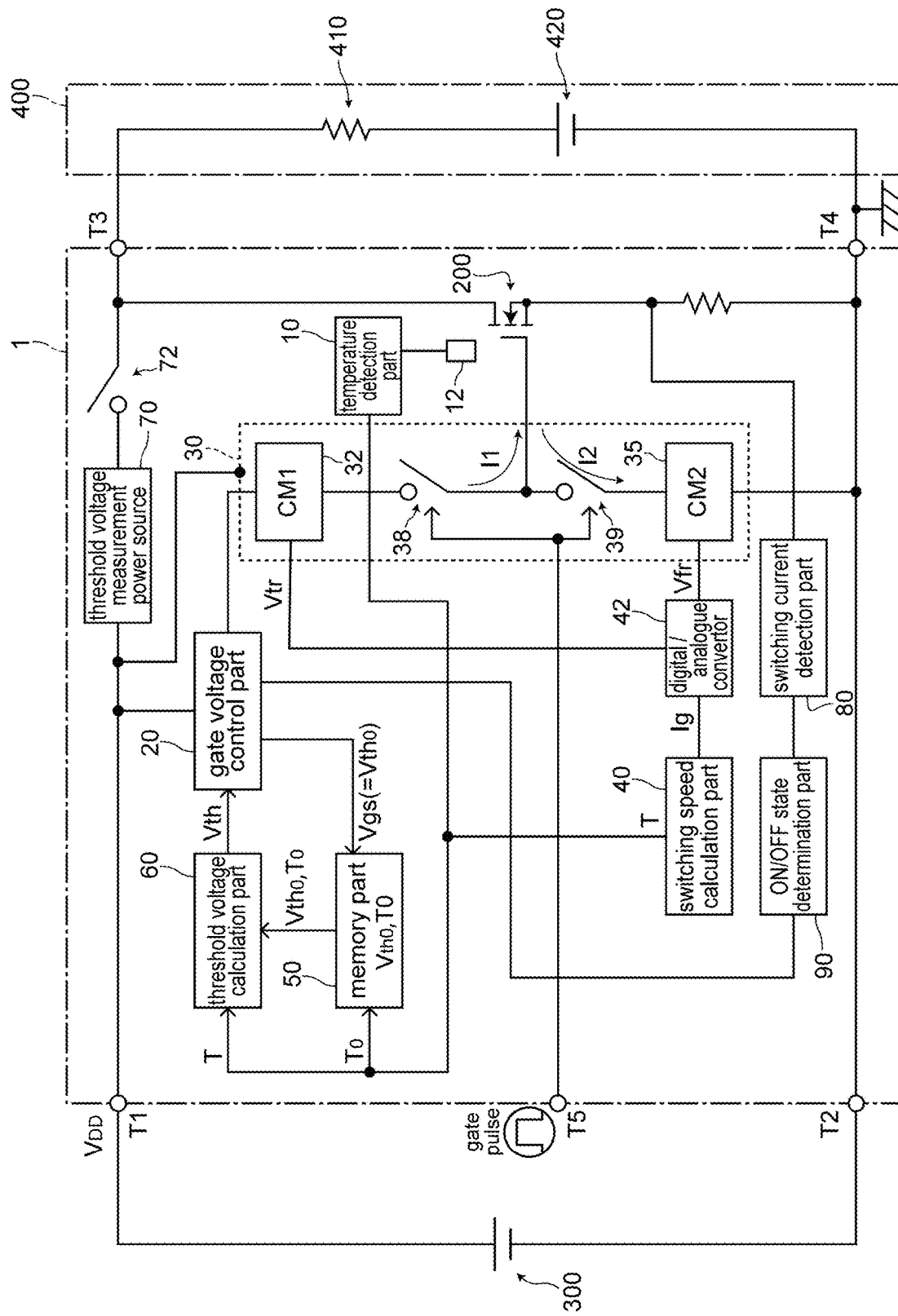
FIG. 1 is a circuit diagram of a power module 1 according to an embodiment 1.

As shown in FIG. 1, a power module 1 according to the embodiment 1 includes a switching element 200, a temperature detection part 10, a gate voltage control part 20 (a control electrode voltage control part), a switching speed control part 30, a switching speed calculation part 40, a memory part 50, a threshold voltage calculation part 60, a threshold voltage measurement power source 70, a switching current detection part 60, an ON/OFF state determination part 90, and a power circuit 400. The power module 1 according to the embodiment 1 is covered by a package formed of a resin, a ceramic or the like having high heat resistance and high insulation property. The power module 1 according to the embodiment 1 includes: a (+) side input terminal T1 to which a power source voltage $V_{DD}$ of a direct current is inputted; a (−) side input terminal T2 on a ground side; a (+) side output terminal T3; a (−) side output terminal T4 on a ground side; and a control terminal T5 to which a drive signal (for example, a gate pulse) Pg is inputted.

A gate drive power source 300 for applying a power source voltage VDC is connected between the (+) side input terminal T1 and the (−) side input terminal T2. The gate drive power source 300 is connected to a gate electrode of the switching element 200 via the gate voltage control part 20 and the switching speed control part 30, and supplies a voltage to the gate electrode. The power circuit 400 is connected to the (+) side output terminal T3 and the (−) side output terminal T4.

The power circuit 400 is connected in series with the switching element 200. The power circuit 400 has a load resistor 410 and a drive power source 420 of a direct current, and the load resistor 410 and the drive power source 420 of a direct current are connected in series between the (+) side output terminal T3 and the (−) side output terminal T4. The (−) side output terminal T4 is grounded.

The switching element 200 is a MOSFET having a source electrode (second electrode), a drain electrode (first electrode), and a gate electrode (control electrode). The switching element 200 is brought into an ON state when a gate voltage (control electrode voltage) which exceeds a threshold voltage is applied to the gate electrode, and is brought into an OFF state when the gate voltage becomes lower than a threshold voltage. The gate voltage is supplied from the power source voltage $V_{DD}$, and is controlled by the gate voltage control part 20 and the switching speed control part 30. In this embodiment 1, a MOSFET is used as the switching element 200. However, a suitable switching element can be used as the switching element 200. The switching element 200 is formed using a material which contains GaN. When the switching element 200 is formed using a material which contains GaN, a difference between an absolute maximum rated voltage and a threshold voltage of the gate electrode becomes small.

The drain electrode of the switching element 200 is connected to the power circuit 400 via the (+) side output terminal T3. The gate electrode of the switching element 200 is connected to the switching speed control part 30. The source electrode of the switching element 200 is connected to the (−) side output terminal T4 via a resistor.

The power module 1 according to the embodiment 1 performs an operation mode by switching between an initial threshold voltage measurement mode where an initial threshold voltage $Vth_0$ of the switching element 200 is measured, and a control mode where an ON/OFF operation of the switching element 200 is controlled.

The temperature detection part 10 has a temperature detection element 12, and detects an operation temperature of the switching element 200. As the temperature detection element 12, a suitable temperature detection element such as a diode or a thermistor which converts a temperature into an amount of electricity and outputs a temperature detection result formed of an electric signal can be used.

The gate voltage control part 20, based on an inputted drive signal Pg (for example, a gate pulse), controls a gate voltage such that the gate voltage is increased in a stepwise manner when a threshold voltage is measured in an initial threshold voltage measurement mode, and controls the gate voltage for controlling an ON/OFF operation of the switching element 200 in a control mode. In the control mode, the gate voltage control part 20 controls a gate voltage based on a threshold voltage Vth during an operation of the switching element 200 calculated by the threshold voltage calculation part 60 based on information including an operation temperature of the switching element 200. The gate voltage control part 20 transmits a signal toward a first control drive current control part 32 and a second control drive current control part 35 of the switching speed control part 30, and controls a first control drive current flowing into the switching element 200 and a second control drive current flowing into a ground side from the switching element such that the gate voltage becomes a desired voltage. The gate voltage control part 20 is connected to the switching speed control part 30, the memory part 50, the threshold voltage calculation part 60, and the ON/OFF state determination part 90.

The switching speed control part 30 controls a switching speed of the switching element 200 based on the operation temperature of the switching element 200 detected by the temperature detection part 10. Accordingly, the switching speed control part 30 adjusts a turn-on period tr and a turn-off period tf of the switching element 200.

The switching speed control part 30 includes the first control drive current control part 32, the second control drive current control part 35, a first switch 38 which is turned on or off in response to a drive signal, and supplies a first control drive current to an input capacitance of the switching element 200 during an ON state, and a second switch 39 which is brought into an OFF state when the first switch 38 is in an ON state, is brought into an ON state when the first switch 38 is in an OFF state in response to a drive signal, and discharges a second control drive current to a ground side. The first switch 38 and the second switch 39 may be formed of a complementary transistor which complementarily performs an ON/OFF operation in response to a drive signal.

Figure 2:
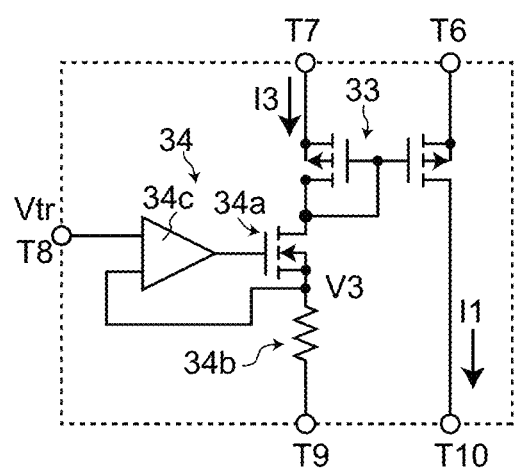
FIG. 2 is a circuit diagram of a first control drive current control part 32 according to the embodiment 1.

The first control drive current control part 32 controls a first control drive current I1 flowing into the switching element 200 based on a gate current amount (control electrode current amount) calculated by the switching speed calculation part 40 and a gate voltage which the gate voltage control part 20 controls based on a threshold voltage Vth during an operation of the switching element 200 (see FIG. 1 and FIG. 2). Specifically, the first control drive current control part 32 allows the first control drive current I1 corresponding to a first reference voltage Vtr calculated based on a gate current amount Ig to flow toward the switching element 200. The first control drive current control part 32 includes: a first current mirror circuit 33 of one stage (may be a plurality of stages) through which the first control drive current I1 proportional to a first drive current I3 flowing into an input side flows; and a first error amplifier circuit 34 which detects the first drive current I3 flowing into the input side of the first current mirror circuit 33 and generates a first drive voltage V3 corresponding to the first drive current I3, and changes the first drive current I3 flowing into the input side of the first current mirror circuit 33 by making the first drive voltage V3 follow the first reference voltage Vtr inputted from a control terminal T8.

The first error amplifier circuit 34 is formed of: a transistor 34a which changes a current value of the first drive current I3; a resistor 34b which detects the first drive current I3 and generates the first drive voltage V3 corresponding to the first drive current I3; and an operation amplifier 34c. A (+) side input terminal of the operation amplifier 34c is connected to the control terminal T8, and has a function of changing the first drive current I3 flowing through the first current mirror circuit 33 by making the first drive voltage V3 inputted into a (−) side input terminal follow a first reference voltage Vtr inputted to the (+) side input terminal.

Figure 3:
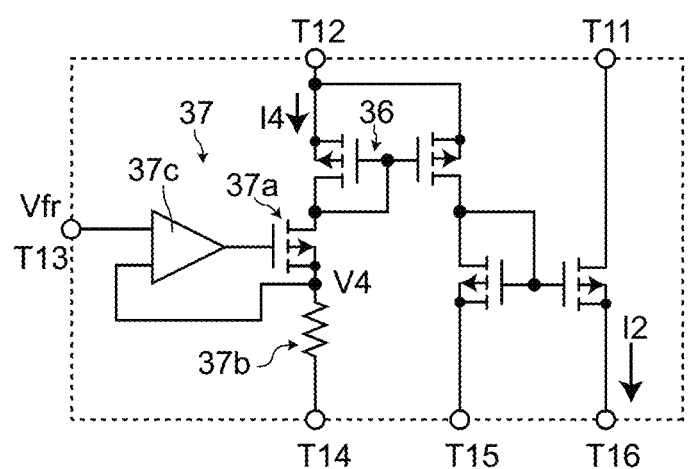
FIG. 3 is a circuit diagram of a second control drive current control part 35 according to the embodiment 1.

The second control drive current control part 35 controls a second control drive current I2 flowing into the switching element 200 based on a gate current amount Ig calculated by the switching speed calculation part 40 and a gate voltage which the gate voltage control part 20 controls based on a threshold voltage Vth during an operation of the switching element 200 (see FIG. 1 and FIG. 3). Specifically, the second control drive current control part 35 allows the second control drive current I2 corresponding to a second reference voltage Vfr which is calculated based on the gate current amount. Ig to flow toward a ground side from the switching element 200. The second control drive current control part 35 includes: a second current mirror circuit 36 of one stage (may be a plurality of stages) through which a second control drive current I2 proportional to a second drive current I4 flowing into an input side; and a second error amplifier circuit 37 which detects the second drive current I4 flowing into the input side of the second current mirror circuit 36 and generates a second drive voltage 74 corresponding to the second drive current I4, and changes the second drive current I4 flowing into the input side of the second current mirror circuit 36 by making the second drive voltage 74 follow the second reference voltage Vfr inputted from a control terminal T13.

The second error amplifier circuit 37 is formed of: a transistor 37a which changes a current value of the second drive current I4; a resistor 37b which detects the second drive current I4 and generates the second drive voltage V4 corresponding to the second drive current I4; and an operation amplifier 37c. A (+) side input terminal of the operation amplifier 37c is connected to the control terminal T13, and has a function of changing the second drive current I4 flowing through the second current mirror circuit 36 by making the second drive voltage V4 inputted into a (−) side input terminal follow a second reference voltage Vfr inputted to the (+) side input terminal.

The switching speed calculation part 40 calculates the gate current amount Ig based on an operation temperature T of the switching element 200 detected by the temperature detection part 10. The gate current amount Ig is converted into the first reference voltage Vtr and the second reference voltage Vfr which are analogue voltages by a digital/analogue converting part (digital/analogue convertor) 42, and thereafter, the first reference voltage Vtr is inputted to the first control drive current control part 32 of the switching speed control part 30, and the second reference voltage Vfr is inputted to the second control drive current control part 35.

The memory part 50 stores information including the initial threshold voltage $Vth_0$ of the switching element, and the initial temperature $T_0$ of the switching element 200 when the initial threshold voltage $Vth_0$ is measured, and information relating to a temperature characteristic of a threshold voltage of the switching element 200. Further, the memory part 50, in the initial threshold voltage measurement mode, when the ON/OFF state determination part 90 determines that the switching element 200 is brought into an ON state, stores a gate voltage applied to the gate electrode as a threshold voltage. The memory part 50 is connected to the temperature detection part 10, the gate voltage control part 20, and the threshold voltage calculation part 60.

Figure 7:
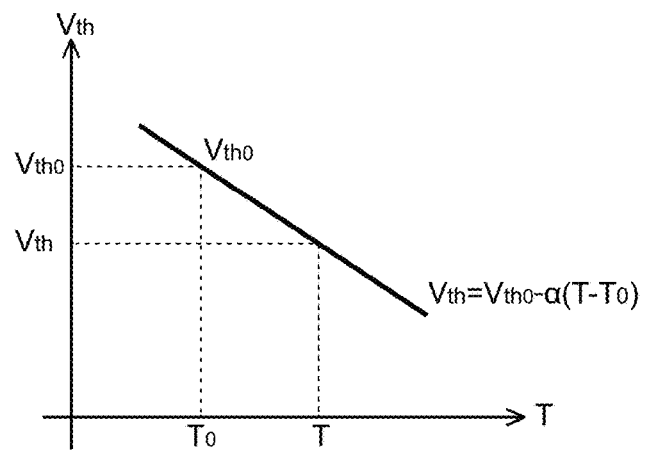
FIG. 7 is a schematic view of a graph indicating a relationship between a threshold voltage Vth and an operation temperature T of a switching element.

Information relating to a temperature characteristic of a threshold voltage in the switching element 200 is a characteristic equation which satisfies a relationship of $Vth=Vth_0-\alpha(T-T_0)$ assuming a temperature coefficient of a threshold voltage in the switching element 200 as $\alpha$, a threshold voltage during an operation of the switching element 200 as Vth, an initial threshold voltage as $Vth_0$, an operation temperature of the switching element 200 detected by the temperature detection part 10 as T, an initial temperature of the switching element 200 when the initial threshold voltage is measured as $T_0$ (see FIG. 7). That is, the relationship between the threshold voltage Vth and the operation temperature T of the switching element 200 is expressed by a linear function having a negative gradient.

The threshold voltage calculation part 60 reads information including an initial threshold voltage $Vth_0$ and an initial temperature $T_0$ of the switching element 200, and information relating to a temperature characteristic of a threshold voltage in the switching element 200 from the memory part 50, and reads an operation temperature T of the switching element 200 from the temperature detection part 10. Then, the threshold voltage calculation part 60 calculates a threshold voltage Vth during an operation by putting these information and value into a characteristic equation of $Vth=Vth_0-\alpha(T-T_0)$.

The threshold voltage measurement power source 70 is connected to the drain electrode of the switching element 200, and in the initial threshold voltage measurement mode, the threshold voltage measurement power source 70 supplies a threshold voltage measurement current to the drain electrode of the switching element 200 by turning on a threshold voltage measurement switch 72. A suitable switch such as a photocoupler, for example, can be used as the threshold voltage measurement switch 72.

A switching current detection part 80 is connected to the source electrode of the switching element 200, and detects a switching current Id (for example, a drain current or a source current) of the switching element 200 in the initial threshold voltage measurement mode. The switching current detection part 80 is connected to an ON/OFF state determination part 90. The switching current detection part 80 measures a current by converting the current into a voltage by supplying the current to the resistor connected to the source electrode of the switching element 200. However, the switching current detection part 80 may use a suitable detection device (for example, a Rogowski coil or the like) for such a measurement.

The ON/OFF state determination part 90, in the initial threshold voltage measurement mode, determines an ON/OFF state of the switching element 200 based on a detection result of a switching current received from the switching current detection part 80. The ON/OFF state determination part 90 is connected to the gate voltage control part 20 and the switching current detection part 80.

2. Operation of power module 1 according to embodiment 1

The power module 1 according to the embodiment 1 is formed such that an operation mode is switched between: the initial threshold voltage measurement mode where an initial threshold voltage $Vth_0$ of the switching element 200 is measured; and the control mode where an ON/OFF operation of the switching element 200 is controlled.

In the power module 1 according to the embodiment 1, first, the initial threshold voltage $Vth_0$ and the initial temperature $T_0$ are detected and calculated by performing the initial threshold voltage measurement mode. Next, an ON/OFF operation of the switching element 200 is controlled by performing the control mode.

(1) Initial Threshold Voltage Measurement Mode

Figure 4:
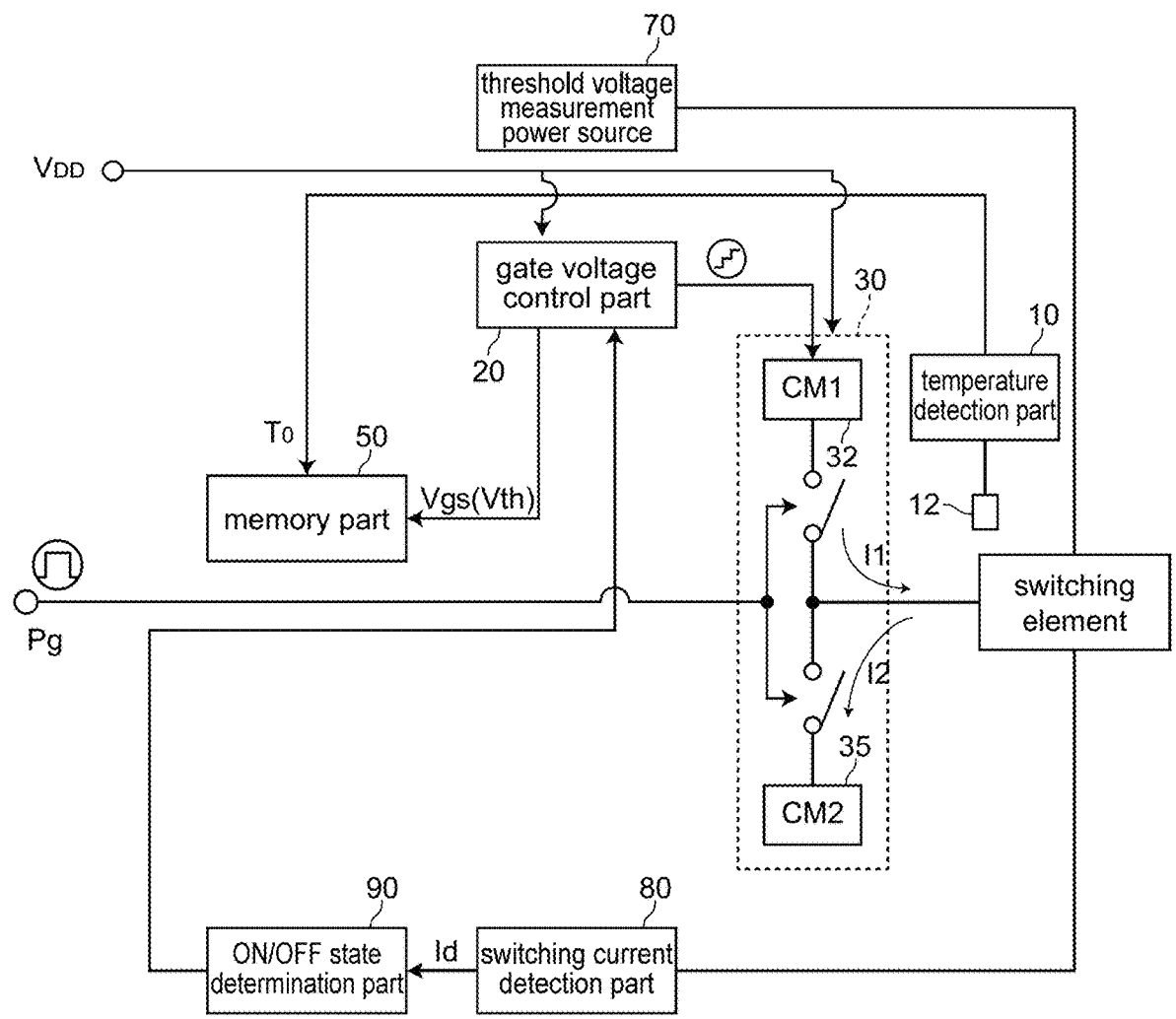
FIG. 4 is a block diagram of an initial threshold voltage measurement mode according to the embodiment 1.

First, a threshold voltage measurement current is supplied to the drain electrode of the switching element 200 from the threshold voltage measurement power source 70 in a state where a current is not supplied from the drive power source 420 (see FIG. 4).

Figure 5:
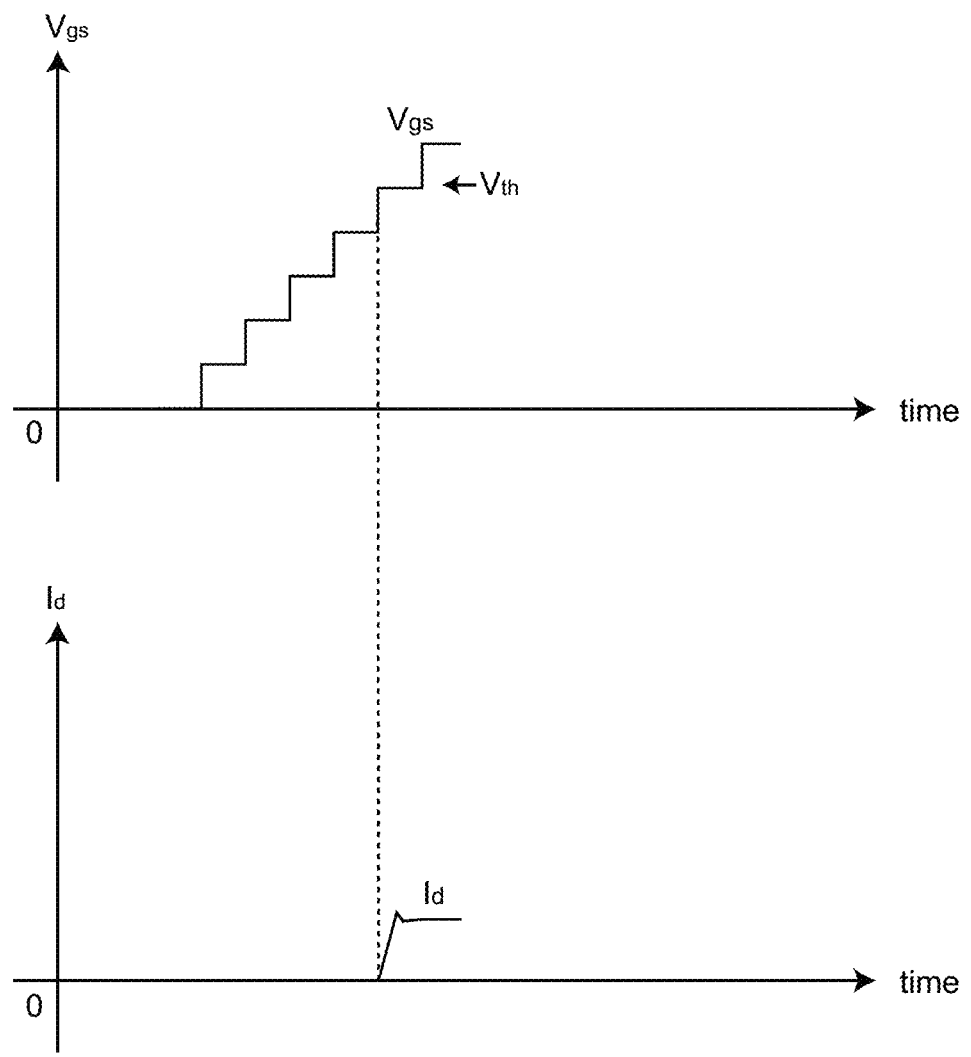
FIG. 5 is a schematic view of graphs of a gate voltage describing the initial threshold voltage measurement mode according to the embodiment 1.

Next, the gate voltage control part 20 controls a gate voltage such that a voltage which is lower than a scheduled initial threshold voltage which is set at the time of designing the power module is applied to the gate electrode (specifically, the gate voltage control part 20 transmits a signal toward the first control drive current control part 32 of the switching speed control part 30, and controls a first control drive current I1 flowing into the switching element 200 and a second control drive current I2 flowing into the ground side from the switching element so as to obtain such a gate voltage). At this stage of operation, a switching current is not detected by the switching current detection part 80 (a value of the switching current being 0) and hence, the ON/OFF state determination part 90 determines that the switching element 200 is in an OFF state. When the ON/OFF state determination part 90 determines that the switching element 200 is in an OFF state, the gate voltage control part 20 controls the gate voltage such that the gate voltage is increased by one stage (see FIG. 5).

When the gate voltage is increased in stages (specifically being increased in a stepwise manner) by repeating such an operation so that the switching current is detected by the switching current detection part 80 (the switching current taking a value other than 0), the ON/OFF state determination part 90 determines that the switching element 200 is in an ON state. At this stage of operation, an operation temperature of the switching element 200 detected by the temperature detection part 10 is transmitted to the memory part 50 as an initial temperature $T_0$, and the gate voltage control part 20 transmits a gate voltage applied to the gate electrode to the memory part 50 as an initial threshold voltage $Vth_0$. The memory part 50 stores the gate voltage as an initial threshold voltage $Vth_0$.

In the initial threshold voltage measurement mode, the gate voltage control part 20 controls a gate voltage such that the gate voltage is increased in a stepwise manner along with a lapse of time and hence, it is possible to acquire an advantageous effect that the threshold voltage of the switching element 200 can be measured efficiently and with certainty.

(2) Control Mode

In the control mode, when the switching element 200 is brought into an ON state, a threshold voltage Vth during an operation is calculated based on an initial threshold voltage $Vth_0$ and an initial temperature $T_0$ measured in the initial threshold voltage measurement mode, an operation temperature T of the switching element 200 detected by the temperature detection part 10, and information (temperature coefficient $\alpha$) relating to a temperature characteristic of the threshold voltage in the switching element preliminarily stored in the memory part 50 (by putting these values and information into a characteristic equation of $(Vth=Vth_0-\alpha(T-T_0))$ (see FIG. 7), and the gate voltage control part 20 applies a gate voltage which slightly exceeds the threshold voltage Vth during an operation which is calculated by the threshold voltage calculation part 60 to the gate electrode.

Figure 6:
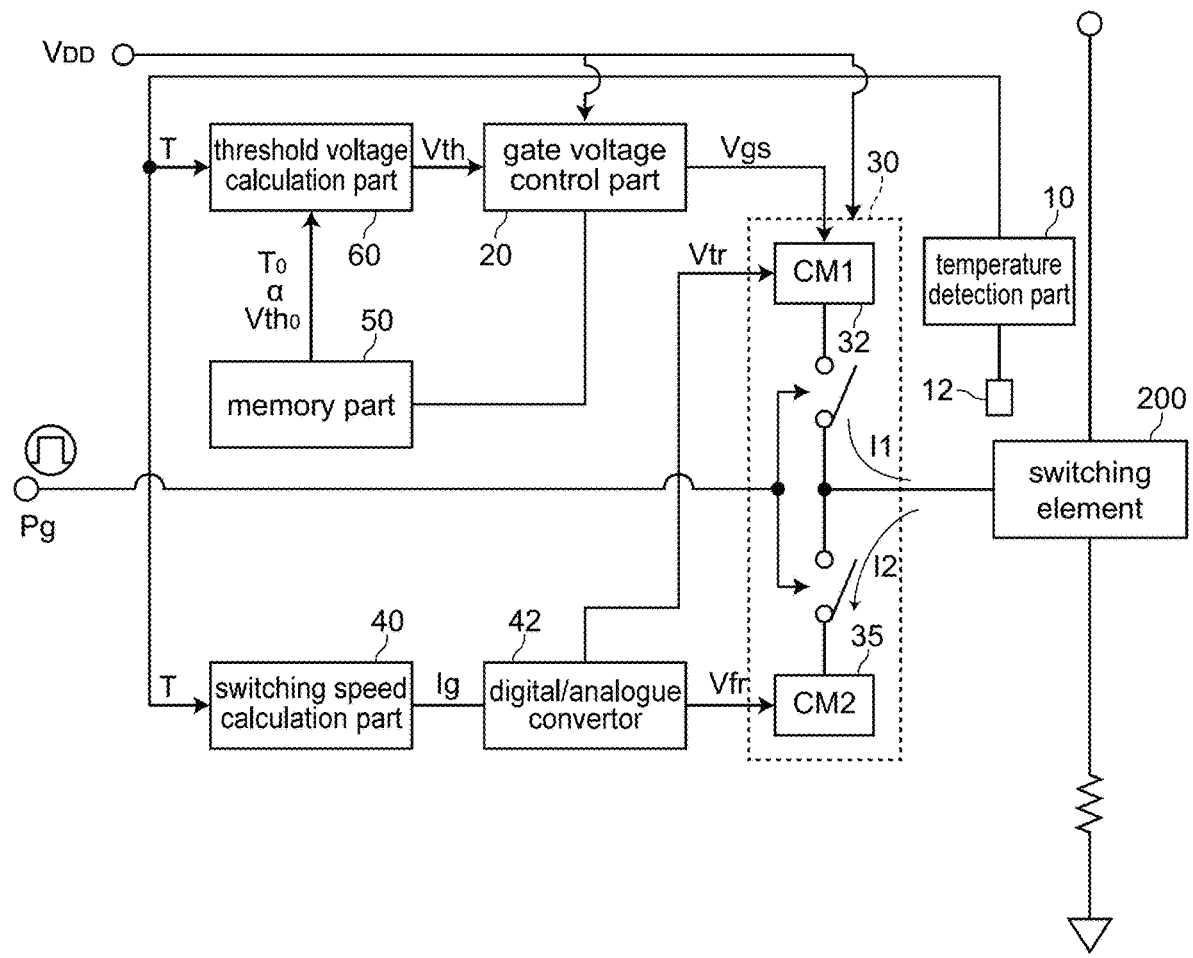
FIG. 6 is a block diagram of a control mode according to the embodiment 1.

In bringing the switching element 200 into an ON state, a gate voltage applied to the gate electrode and the turn-on period tr are decided as follows (see FIG. 6).

(2-1) Threshold Voltage

First, the temperature detection part 10 detects an operation temperature T of the switching element 200 via the temperature detection element 12.

The threshold voltage calculation part 60 reads information including an initial threshold voltage $Vth_0$ of the switching element 200 detected in the initial threshold voltage measurement mode and an initial temperature $T_0$ of the switching element 200 when the initial threshold voltage $Vth_0$ is measured, and information relating to a temperature characteristic of the threshold voltage in the switching element 200 from the memory part 50, reads an operation temperature T of the switching element 200 from the temperature detection part 10, and calculates a threshold voltage Vth during an operation of the switching element 200 by putting these information and value to a characteristic equation of $Vth=Vth_0-\alpha(T-T_0)$.

Figure 8A:
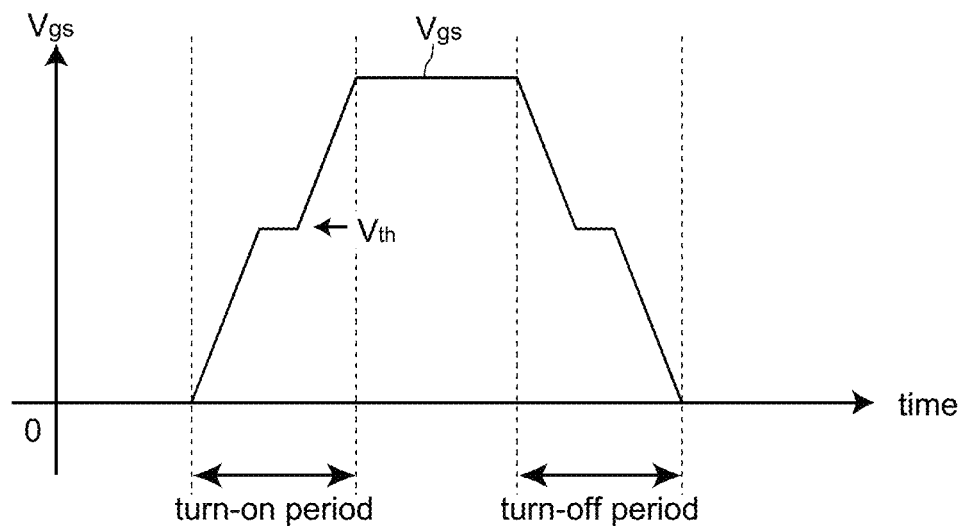
FIG. 8A and FIG. 8B are schematic views of graphs of a change with time of a gate voltage (a gate-source voltage) Vgs describing an effect when a gate voltage which slightly exceeds a threshold voltage is applied to the gate electrode
Figure 8B:
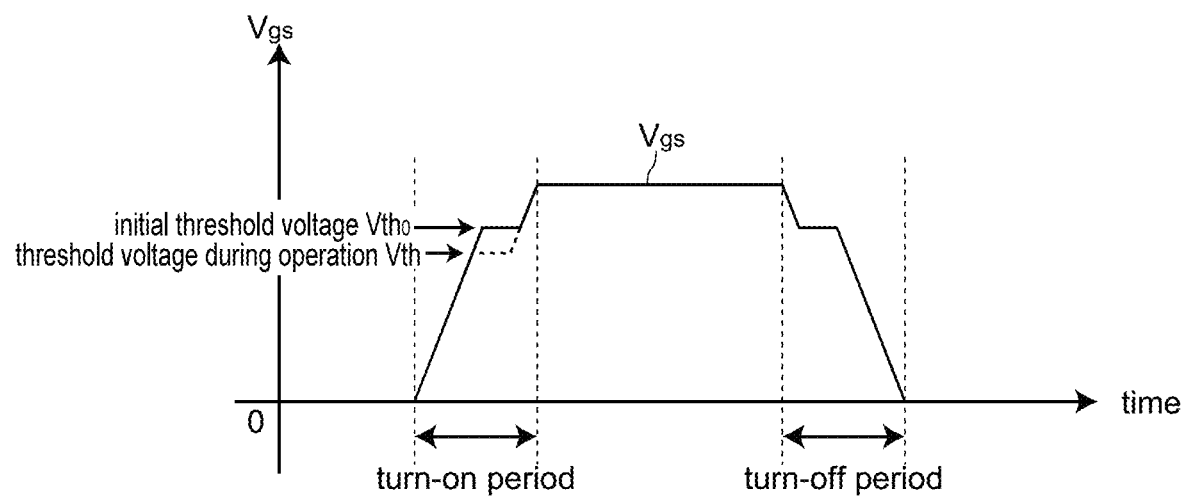

Next, the gate voltage control part 20 controls a gate voltage such that the gate voltage which slightly exceeds the threshold voltage Vth is applied to the gate electrode based on the threshold voltage Vth during the operation of the switching element 200 which is calculated by the threshold voltage calculation part 60 (see FIG. 8B). In this manner, an ON/OFF operation of the switching element 200 is controlled.

In the power module 1 according to the embodiment 1, a gate voltage may be controlled by constantly following a temperature of the switching element 200, or the gate voltage may be controlled based on a threshold voltage during the operation of the switching element 200 by calculating such a threshold voltage during the operation by detecting an operation temperature of the switching element 200 at a predetermined time interval.

(2-2) Switching Speed

First, the temperature detection part 10 detects an operation temperature T of the switching element 200 via the temperature detection element 12.

Next, the switching speed calculation part 40 reads an operation temperature T of the switching element 200 from the temperature detection part 10, and calculates a gate current amount Ig.

The digital/analogue convertor 42 converts the gate current amount Ig into a first reference voltage Vtr and a second reference voltage Vfr which are analogue voltages, inputs the first reference voltage Vtr to the first control drive current control part 32 of the switching speed control part 30, and inputs the second reference voltage Vfr to the second control drive current control part 35 of the switching speed control part 30.

In the first control drive current control part 32, the first error amplifier circuit 34 detects a first drive current I3 flowing into an input side of the first current mirror circuit 33. Based on such detection of the first drive current I3, (1) the first error amplifier circuit 34 allows a first control drive current I1 which is proportional to the first drive current I3 flowing into an input side to flow toward an output side, and (2) the first error amplifier circuit 34 generates a first drive voltage V3 which corresponds to the first drive current I3, and changes the first drive current I3 flowing into an input side of the first current mirror circuit 33 by making the first drive voltage V3 follow the first reference voltage Vtr inputted from the control terminal T8.

In allowing the first control drive current I1 which is proportional to the first drive current I3 flowing into the input side to flow into the output side (switching element side) as described in the above-mentioned (1), the first control drive current I1 is allowed to flow into the output side such that a gate voltage which slightly exceeds a threshold voltage Vth during an operation is applied to the gate electrode.

When an operation temperature of the switching element is increased during an operation, in the switching speed calculation part 40, a gate current amount Ig which corresponds to the operation temperature is calculated again, and a first reference voltage Vtr changes. Then, a first drive current I3 which follows the first reference voltage Vtr changes and hence, the first control drive current I1 changes (the first control drive current I1 changing so as to shorten a turn-on period).

At the time of performing a turn-off operation, in the second control drive current control part 35 (see FIG. 3), the second error amplifier circuit 37 detects a second drive current I4 flowing into the input side of the second current mirror circuit 36. Based on such detection of the second drive current I4, (1) the second error amplifier circuit 37 allows a second control drive current I2 which is proportional to the second drive current I4 flowing into an input side to flow toward an output side, and (2) the second error amplifier circuit 37 generates a second drive voltage V4 which corresponds to the second drive current I4, and changes the second drive current I4 flowing into an input side of the second current mirror circuit 36 by making the second drive voltage V4 follow the second reference voltage Vfr inputted from the control terminal T13.

3. Advantageous Effects Acquired by the Power Module 1 According to the Embodiment 1

In the power module 1 according to the embodiment 1, the power module L includes the gate voltage control part 20 which controls a gate voltage based on a threshold voltage Vth during an operation of the switching element 200 which is calculated based on information including an operation temperature T of the switching element 200. Accordingly, even when the threshold voltage Vth during the operation changes from an initial threshold voltage $Vth_0$ due to a fact that the operation temperature of the switching element 200 during the operation becomes higher than the Initial temperature $T_0$ of the switching element 200 when an initial threshold voltage $Vth_0$ is measured (see FIG. 7), it is possible to apply a voltage which slightly exceeds the threshold voltage Vth during the operation to the gate electrode (see FIG. 8B). As a result, a turn-on period and a turn-off period can be shortened and hence, a switching loss can be reduced.

Figure 9:
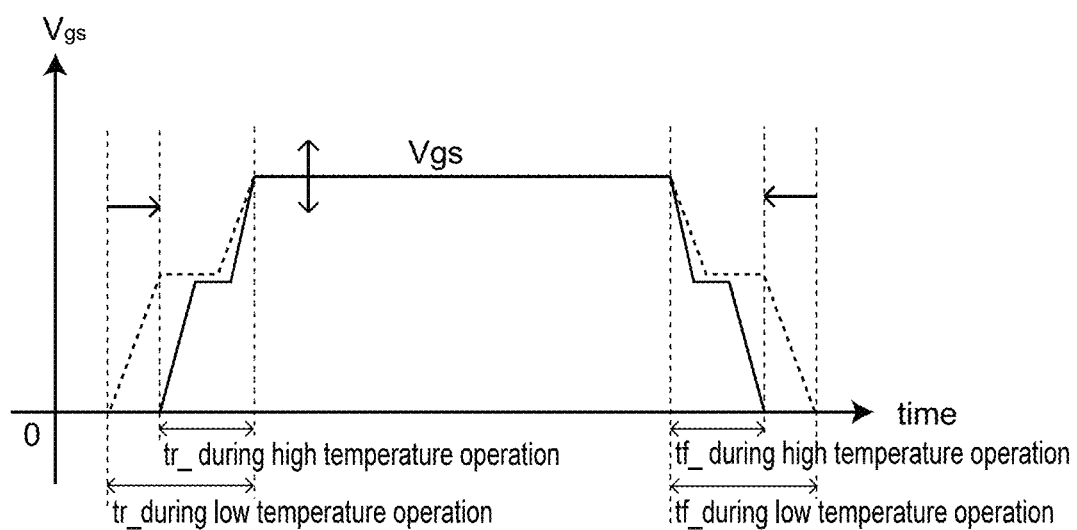
FIG. 9 is a schematic graph showing a switching operation waveform describing an effect of the power module 1 according to the embodiment 1.

Further, in the power module 1 according to the embodiment 1, the power module 1 includes the switching speed control part 30 which controls a switching speed based on an operation temperature T of the switching element 200. Accordingly, even when the operation temperature T is increased so that a module loss (conduction loss) is increased, a change in total loss (a sum of switching loss and a conduction loss) based on a temperature can be reduced by adjusting (increasing, see tr_during the high temperature operation in FIG. 9) the switching speed (see FIG. 9). The power module 1 of the embodiment 1 further includes the gate voltage control part 20 which controls a gate voltage based on a threshold voltage Vth during an operation of the switching element 200 calculated based on information including the operation temperature T of the switching element 200. Accordingly, a switching time can be more properly adjusted by taking into account a turn-on period and a turn-off period which are shortened due to applying of a voltage which slightly exceeds a threshold voltage Vth during the operation of the switching element 200 to the gate electrode. As a result, a change in total loss based on temperature can be further reduced.

Further, in the power module 1 according to the embodiment 1, the power module 1 includes the threshold voltage calculation part 60 which calculates a threshold voltage Vth during an operation of the switching element 200 based on information including an operation temperature T of the switching element 200 which is detected by the temperature detection part 10, an initial threshold voltage $Vth_0$ of the witching element 200, and an initial temperature $T_0$ of the switching element 200 when the initial threshold voltage $Vth_0$ is measured, and information relating to a temperature characteristic of the threshold voltage in the switching element 200. The gate voltage control part 20, when the switching element 200 is brought into an ON state, controls a gate voltage based on the threshold voltage Vth during the operation of the switching element 200 which is calculated by the threshold voltage calculation part 60 and hence, the threshold voltage Vth during the operation which corresponds to a change in temperature of the switching element 200 can be calculated. Accordingly, the threshold voltage Vth during the operation can be calculated with high accuracy and hence, a voltage which slightly exceeds the threshold voltage Vth during the operation can be applied to the gate electrode.

Further, in the power module 1 according to the embodiment 1, assuming a temperature coefficient of a threshold voltage in the switching element as a, a threshold voltage during the operation of the switching element as Vth, an initial threshold voltage as $Vth_0$, the operation temperature of the switching element detected by the temperature detection part 10 as T, and an initial temperature of the switching element when the initial threshold voltage is measured as $T_0$, information relating to a temperature characteristic of the threshold voltage in the switching element 200 is a characteristic equation which satisfies the relationship of $Vth=Vth_0-\alpha(T-T_0)$. Accordingly, the threshold voltage Vth during the operation of the switching element 200 can be calculated relatively easily.

The power module 1 according to the embodiment 1 includes the switching speed calculation part 40 which calculates a gate current amount Ig based on an operation temperature T of the switching element 200 detected by the temperature detection part 10. The switching speed control part 30 includes: a first control drive current control part 32 which controls a first control drive current I1 flowing into the switching element 200 based on a gate current amount Ig calculated by the switching speed calculation part 40 and a gate voltage which the gate voltage control part 20 controls based on a threshold voltage Vth during the operation of the switching element 200; and the second control drive current control part 35 which controls a second control drive current I2 flowing into a ground side from the switching element 200 based on a gate current amount calculated by the switching speed calculation part 40 and a gate voltage which the gate voltage control part 20 controls based on the threshold voltage Vth during the operation of the switching element 200. Accordingly, the first control drive current I1 and the second control drive current I2 can be properly controlled based on a gate current amount. As a result, a gate voltage under a desired condition is applied and hence, a desired turn-on period and a desired turn-off period can be acquired.

In the power module 1 according to the embodiment 1, the first control drive current control part 32 allows a first control drive current I1 corresponding to a first reference voltage Vtr which is calculated based on a gate current amount Ig to flow toward the switching element 200. Accordingly, when an operation temperature T of the switching element 200 is increased, the first control drive current I1 can be controlled by adjusting a gate current amount Ig (eventually, the first reference voltage Vtr) and hence, a turn-on period tr can be shortened. As a result, a switching loss (turn-on loss) can be reduced even when an operation temperature of the switching element is increased so that a conduction loss is increased. Eventually, a change in total loss based on temperature can be reduced with certainty.

In the power module 1 according to the embodiment 1, the second control drive current control part 35 allows a second control drive current I2 corresponding to a second reference voltage Vfr which is calculated based on a gate current amount Ig to flow toward a ground side from the switching element. Accordingly, when an operation temperature T of the switching element 200 is increased, the second control drive current I2 can be controlled by adjusting a gate current amount (eventually, the second reference voltage Vfr) and hence, a turn-off period tf can be shortened by controlling the second control drive current I2. As a result, a switching loss (turn-off loss) can be reduced even when an operation temperature T of the switching element 200 is increased so that a conduction loss is increased. Eventually, a change in total loss based on temperature can be reduced with certainty.

In the power module 1 according to the embodiment 1, the first control drive current control part 32 includes: the first current mirror circuit 33 into which the first control drive current I1 flows; and the first error amplifier circuit 34 which detects a first drive current I3 and generates a first drive voltage V3 corresponding to the first drive current I3, and changes the first drive current I3 by making the first drive voltage V3 follow the first reference voltage Vtr. The second control drive current control part 35 includes: the second current mirror circuit 36 into which the second control drive current I2 flows; and the second error amplifier circuit 37 which detects a second drive current I4 and generates a second drive voltage V4 corresponding to the second drive current I4, and changes the second drive current I4 by making the second drive voltage V4 follow the second reference voltage Vfr. Accordingly, the first control drive current I1 and the second control drive current I2 can be controlled such that the first control drive current I1 and the second control drive current I2 follow an operation temperature T of the switching element 200.

In the power module 1 according to the embodiment 1, in the initial threshold voltage measurement mode, an actual threshold voltage of the switching element 200 which is actually connected to the power module 1 can be measured. Accordingly, even when an actual threshold voltage changes from a designed threshold voltage due to irregularities in the manufacture of the switching element 200, it is possible to apply a gate voltage which slightly exceeds an actual threshold voltage to the gate electrode of the switching element 200 based on the actual threshold voltage when the switching element 200 is brought into an ON state (see FIG. 8B). Accordingly, compared to a case where a gate voltage which largely exceeds a threshold voltage is applied to the gate electrode of the switching element 200 for controlling an ON/OFF operation of the switching element 200 with certainty (comparison example, see FIG. 8A), a turn-on period and a turn-off period can be shortened and hence, a switching speed of the switching element 200 can be increased. As a result, a switching loss of the switching element 200 can be reduced.

Further, in the power module 1 according to the embodiment 1, when the switching element 200 is brought into an ON state as described above, a gate voltage which slightly exceeds an actual threshold voltage can be applied to the gate electrode based on the actual threshold voltage. Accordingly, even in the case where the actual threshold voltage changes in a direction that the actual threshold voltage becomes higher than a designed threshold voltage due to irregularities in the manufacture of the switching element 200, a gate voltage which slightly exceeds the actual threshold voltage can be applied to the gate electrode. Accordingly, it is possible to prevent the occurrence of a phenomenon that the switching element 200 is not brought into an ON state even when a gate voltage which slightly exceeds a threshold voltage (designed threshold voltage) is applied to the gate electrode. As a result, an ON/OFF operation of the switching element 200 can be controlled with certainty.

Particularly, even in the case where a difference between an absolute maximum rated voltage and a threshold voltage is small as in the case where the switching element 200 is formed using a material which contains GaN, a gate voltage which slightly exceeds an actual threshold voltage can be applied to the gate electrode and hence, it is possible to prevent the occurrence of the phenomenon that the switching element 200 is not brought into an ON state even when the gate voltage which slightly exceeds the threshold voltage (designed threshold voltage) is applied to the gate electrode. As a result, an ON/OFF operation of the switching element 200 can be controlled with certainty.

Further, in the power module 1 according to the embodiment 1, an actual threshold voltage can be measured in the initial threshold voltage measurement mode, and a gate voltage applied to the gate electrode can be controlled based on information including an actual threshold voltage when the switching element is brought into an ON state in the control mode. Accordingly, even when the switching elements 200 are manufactured on a mass production basis, before the switching elements 200 are connected to the power modules 1, it is unnecessary to measure threshold voltages of the manufactured respective switching elements. Accordingly, an operation of manufacturing switching elements does not become cumbersome and hence, productivity can be easily enhanced.

Still further, in the power module 1 according to the embodiment 1, the switching element 200 is formed using a material which contains GaN. Accordingly, an ON resistance of the switching element 200 is lowered and hence, it is possible to provide a power module having a small conduction loss.

Embodiment 2

A power module according to the embodiment 2 (not shown in the drawings) basically has substantially the same configuration as the power module 1 according to the embodiment 1. However, the power module according to the embodiment 2 differs from the power module 1 according to the embodiment 1 with respect to a point that the power module according to the embodiment 2 includes a temperature characteristic calculation part. The power module according to the embodiment 2 performs a temperature characteristic measurement mode where a temperature characteristic of a threshold voltage in a switching element 200 is measured after a control mode is performed for a predetermined time.

Figure 10:
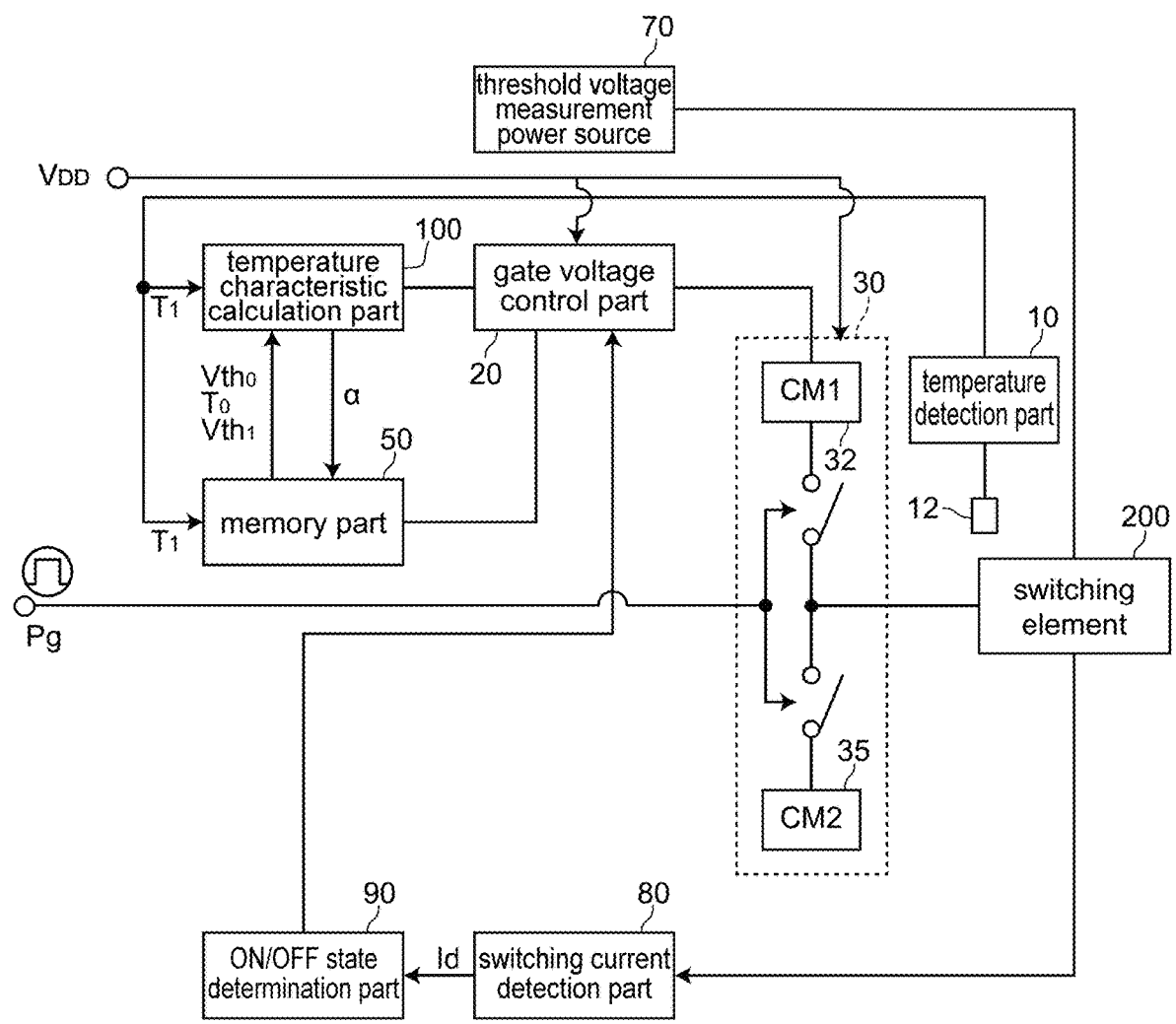
FIG. 10 is a block diagram of a temperature characteristic measurement mode according to an embodiment 2.

The temperature characteristic calculation part 100 is connected to a temperature detection part 10 and a memory part 50, and calculates a temperature characteristic of a threshold voltage in the switching element 200 (see FIG. 10).

The following operation is performed in the temperature characteristic measurement mode.

After the control mode is performed for a predetermined time, a current for threshold voltage measurement is supplied from a threshold voltage measurement power source 70 to a drain electrode of the switching element 200 in a state where a current is not supplied from a drive power source 420 (see FIG. 10).

Next, the gate voltage control part 20 controls a gate voltage such that a voltage lower than a scheduled threshold voltage (during an operation) which is set at the time of designing the power module is applied to the gate electrode. At this stage of operation, a switching current is not detected by the switching current detection part 80 (a value of the switching current being 0) and hence, an ON/OFF state determination part 90 determines that the switching element 200 is in an OFF state. When the ON/OFF state determination part 90 determines that the switching element 200 is in an OFF state, the gate voltage control part 20 controls the gate voltage such that the gate voltage is increased by one stage (see FIG. 5).

When the gate voltage is increased in stages (specifically being increased in a stepwise manner) by repeating such an operation so that a switching current is detected by the switching current detection part 80 (the switching current taking a value other than 0), the ON/OFF state determination part 90 determines that the switching element 200 is in an ON state. At this stage of operation, an operation temperature $T_1$ of the switching element 200 detected by the temperature detection part 10 is transmitted to the memory part 50, and the memory part 50 stores the operation temperature $T_1$. Further, the gate voltage control part 20 transmits a gate voltage Vgs applied to the gate electrode to the memory part 50 as a temperature characteristic measurement time threshold voltage $Vth_1$, and the memory part 50 stores the gate voltage Vgs as the temperature characteristic measurement time threshold voltage $Vth_1$.

Next, the temperature characteristic calculation part 100 reads information including an initial threshold voltage $Vth_0$, an initial temperature $T_0$ of the switching element 200 when the initial threshold voltage $Vth_0$ is measured and the temperature characteristic measurement time threshold voltage $Vth_1$, the operation temperature $T_1$ of the switching element 200 detected by the temperature detection part 10 in the temperature characteristic measurement mode from the memory part 50, and calculates a temperature characteristic (to be more specific, a temperature coefficient α) by putting Vth=$Vth_1$ and T=$T_1$ to a characteristic equation of Vth=$Vth_0$−α(T−$T_0$) respectively. The calculated temperature coefficient α is stored in the memory part 50.

In the control mode, a threshold voltage calculation part 60 calculates a threshold voltage Vth based on the temperature coefficient α calculated in the temperature characteristic measurement mode, the operation temperature T of the switching element 200 detected by the temperature detection part 10, the initial threshold voltage $Vth_0$ stored in the memory part 50, the initial temperature $T_0$ of the switching element 200 when the initial threshold voltage $Vth_0$ is measured, and controls a gate voltage based on the threshold voltage Vth.

In this manner, the power module according to the embodiment 2 differs from the power module 1 according to the embodiment 1 with respect to the point that the power module according to the embodiment 2 further includes the temperature characteristic calculation part. However, in the same manner as the case of the power module 1 according to the embodiment 1, in the power module 1 according to the embodiment 1, the power module 1 includes the gate voltage control part 20 which controls a gate voltage based on a threshold voltage Vth during an operation of the switching element 200 which is calculated based on information including an operation temperature T of the switching element 200. Accordingly, even when the threshold voltage Vth during the operation changes from an initial threshold voltage $Vth_0$ due to a fact that the operation temperature of the switching element 200 during the operation becomes higher than the initial temperature $T_0$ of the switching element 200 when an initial threshold voltage $Vth_0$ is measured (see FIG. 7), it is possible to apply a voltage which slightly exceeds the threshold voltage Vth during the operation to the gate electrode (see FIG. 8B). As a result, a turn-on period and a turn-off period can be shortened and hence, a switching loss of the switching element can be reduced.

Further, the power module according to the embodiment 2 includes the temperature characteristic calculation part 100, and the temperature characteristic calculation part 100 calculates a temperature characteristic of a threshold voltage in the switching element 200 based on information including an initial threshold voltage $Vth_0$, an initial temperature $T_0$ of the switching element 200 when the initial threshold voltage $Vth_0$ is measured, an operation temperature T of the switching element 200 detected by the temperature detection part 10 in the temperature characteristic measurement mode, and a temperature characteristic measurement time threshold voltage $Vth_1$. Accordingly, even in the case where there are irregularities in temperature characteristics of threshold voltages in the switching elements 200, a threshold voltage of the switching element 200 can be accurately calculated. As a result, the gate voltage can be further accurately controlled.

The power module according to the embodiment 2 has substantially the same configuration as the power module 1 according to the embodiment 1 with respect to points other than the point that the power module according to the embodiment 2 further includes the temperature characteristic calculation part. Accordingly, the power module according to the embodiment 2 acquires the corresponding advantageous effects found amongst all advantageous effects which the power module 1 according to the embodiment 1 acquires.

The present invention has been described heretofore based on the above-mentioned embodiments, the present invention is not limited to the above-mentioned embodiments. The present invention can be carried out in various modes without departing from the gist of the present invention. For example, the following modifications are also conceivable.

(1) The number and the like of the constitutional elements described in the above-mentioned embodiments are provided only for an exemplifying purpose, and can be changed within a range where advantageous effects of the present invention are not impaired.

(2) In the above-mentioned respective embodiments, the power module which performs an initial threshold voltage measurement mode, a control mode, and a temperature characteristic measurement mode is used as the power module according to the present invention. However, the present invention is not limited to such a power module. For example, a power module which performs a control mode and a temperature characteristic measurement mode may be adopted as the power module according to the present invention. In this case, an initial threshold voltage $Vth_0$ and an initial temperature $T_0$ are preliminarily stored in a memory part.

(3) In the above-mentioned respective embodiments, information relating to temperature characteristic of a threshold voltage in the switching element is a characteristic equation which satisfies the relationship of $Vth=Vth_0-\alpha(T-T_0)$ However, the present invention is not limited to such a case. For example, the information relating to a temperature characteristic of a threshold voltage in a switching element may be another characteristic equation, or may be data indicating a relationship between a temperature and a threshold voltage preliminarily stored in a memory part (on a 1 to 1 basis).

Figure 11:
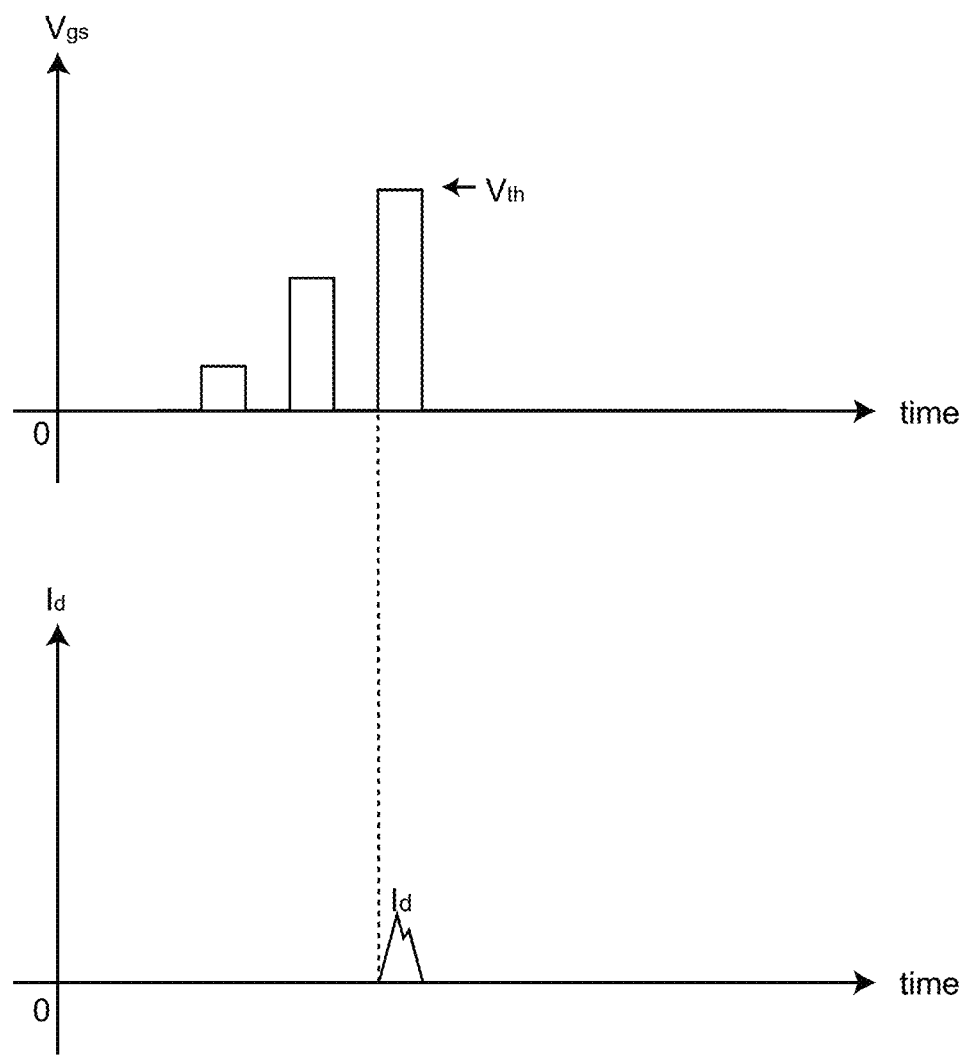
FIG. 11 is a schematic view of a graph describing an initial threshold voltage measurement mode of a power module according to a modification.
Figure 12:
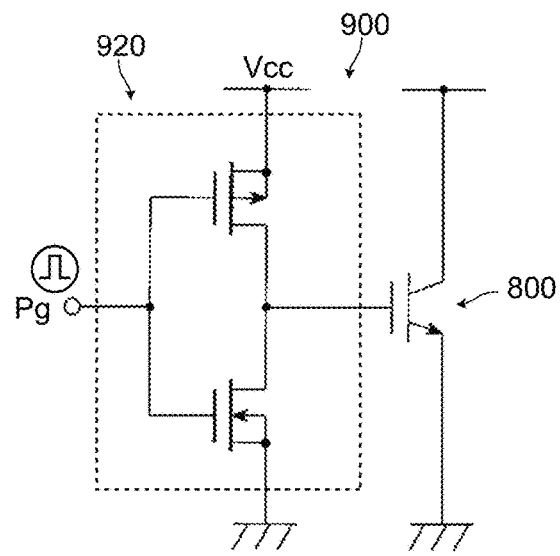
FIG. 12 is a view for describing a conventional power module 900.
Figure 13:
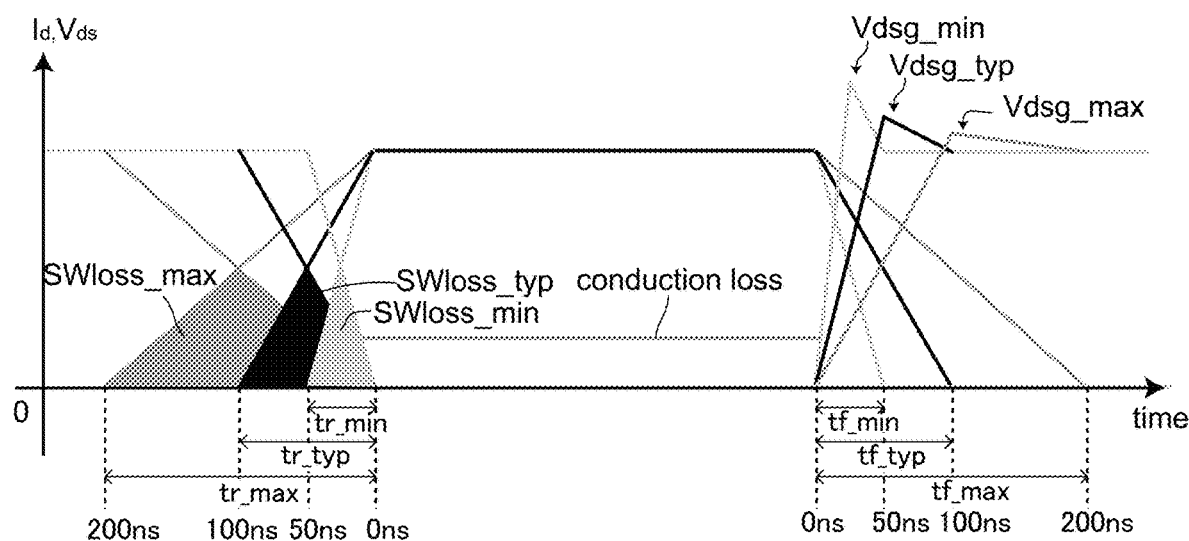
FIG. 13 is a schematic graph showing a switching operation waveform of the conventional power module 900.

(4) In the above-mentioned respective embodiments, in an initial threshold voltage measurement mode, the gate voltage control part 20 controls a gate voltage such that the gate voltage is increased in a stepwise manner with a lapse of time. However, the present invention is not limited to such a case. For example, the gate voltage control part 20 may control a gate voltage such that the gate voltage become a pulse-like voltage which is a pulse whose amplitude is increased with a lapse of time (see FIG. 11).

(5) In the above-mentioned respective embodiments, the power module has one switching element. However, the present invention is not limited to such a configuration. The power module may include a plurality of switching elements. In this case, the power module may control the plurality of switching elements.

(6) In the above-mentioned respective embodiments, the switching element is formed using a material which contains GaN. However, the present invention is not limited to such a switching element. The switching element may be formed using a material which contains a wide gap semiconductor such as SiC or $Ga_2O_3$, or a material which contains silicon.

(7) in the above-mentioned embodiments, a MOSFET is used as the switching element. However, the present invention is not limited to such a switching element. A switching element other than a MOSFET (for example, a HEMT, an IGBT or the like) may be used as the switching element.

(8) In the above-mentioned respective embodiments, the control circuit and the power circuit of the power module may be formed as separate semiconductor substrates or the control circuit and the power circuit of the power module may be formed of the same semiconductor substrate. Further, the switching element and the circuit parts other than the switching element may be formed on separate semiconductor substrates or the switching element (for example, the semiconductor element having the lateral structure made of GaN) and the circuit parts other than the switching element may be formed on the same semiconductor substrate.

The invention claimed is:

1. A power module, comprising:
a switching element having a first electrode, a second electrode, and a control electrode;
a temperature detection part which detects an operation temperature of the switching element;
a control electrode voltage control part which controls a control electrode voltage based on a threshold voltage during an operation of the switching element which is calculated based on information including the operation temperature of the switching element;
a switching speed control part which controls a switching speed of the switching element based on the operation temperature of the switching element;
a memory part which stores information including an initial threshold voltage of the switching element and an initial temperature of the switching element when the initial threshold voltage is measured and information relating to a temperature characteristic of a threshold voltage in the switching element; and
a threshold voltage calculation part which calculates a threshold voltage during an operation of the switching element based on information including the operation temperature of the switching element which is detected by the temperature detection part, an initial threshold voltage of the switching element, and an initial temperature of the switching element when the initial threshold voltage is measured, and information relating to a temperature characteristic of a threshold voltage in the switching element, wherein
the control electrode voltage control part, when the switching element is brought into an ON state, controls a control electrode voltage based on a threshold voltage during the operation of the switching element which is calculated by the threshold voltage calculation part.

2. The power module according to claim 1, wherein assuming a temperature coefficient of a threshold voltage in the switching element as a, a threshold voltage during the operation of the switching element as Vth, the initial threshold voltage as $Vth_0$, the operation temperature of the switching element detected by the temperature detection part as T, and an initial temperature of the switching element when the initial threshold voltage is measured as $T_0$, information relating to the temperature characteristic of the threshold voltage in the switching element is a characteristic equation which satisfies the relationship of $Vth=Vth_0-\alpha(T-T_0)$.

3. The power module according to claim 1, further comprising a switching speed calculation part which calculates a control electrode current amount based on the operation temperature of the switching element detected by the temperature detection part, wherein
the switching speed control part includes:
a first control drive current control part which controls a first control drive current flowing into the switching element based on the control electrode current amount which is calculated by the switching speed calculation part and the control electrode voltage which the control electrode voltage control part controls; and
a second control drive current control part which controls a second control drive current flowing into a ground side from the switching element based on the control electrode current amount which is calculated by the switching speed calculation part and a control electrode voltage which the control electrode voltage control part controls.

4. The power module according to claim 3, wherein
the first control drive current control part allows a first control drive current corresponding to a first reference voltage which is calculated based on the control electrode current amount to flow toward the switching element, and
the second control drive current control part allows a second control drive current corresponding to a second reference voltage which is calculated based on the control electrode current amount to flow toward a ground side from the switching element.

5. The power module according to claim 4, wherein
the first control drive current control part includes:
a first current mirror circuit of one stage or a plurality of stages into which the first control drive current flows, and
a first error amplifier circuit which detects a first drive current at an input side of the first current mirror circuit and generates a first drive voltage corresponding to the first drive current, and changes the first drive current by making the first drive voltage follow the first reference voltage, and
the second control drive current control part includes:
a second current mirror circuit of one stage or a plurality of stages into which the second control drive current flows, and
a second error amplifier circuit which detects a second drive current at an input side of the second current mirror circuit and generates a second drive voltage corresponding to the second drive current, and changes the second drive current by making the second drive voltage follow the second reference voltage.

6. The power module according to claim 1, wherein
the power module is a power module which performs an initial threshold voltage measurement mode where the initial threshold voltage of the switching element is measured, and a control mode where an ON/OFF operation of the switching element is controlled,
the power module further comprises:
a threshold voltage measurement power source which supplies a threshold voltage measurement current to the first electrode of the switching element;
a switching current detection part which detects a switching current which flows through the switching element; and
an ON/OFF state determination part which determines an ON/OFF state of the switching element, and
in the initial threshold voltage measurement mode,
the control electrode voltage control part controls the control electrode voltage such that the control electrode voltage is increased in a stepwise manner,
the ON/OFF state determination part determines whether or not the switching element is turned on base on the switching current which is detected by the switching current detection part, and
the memory part, when the ON/OFF state determination part determines that the switching element is brought into an ON state, stores the operation temperature of the switching element, and stores the control electrode voltage applied to the control electrode as the initial threshold voltage of the switching element.

7. The power module according to claim 6, wherein
the power module is a power module which further performs a temperature characteristic measurement mode where a temperature characteristic of a threshold voltage in the switching element is measured after the control mode is performed for a predetermined time,
the power module further comprises a temperature characteristic calculation part which calculates a temperature characteristic of a threshold voltage in the switching element, and
in the temperature characteristic measurement mode,
the control electrode voltage control part controls the control electrode voltage such that the control electrode voltage is increased in a stepwise manner,
the ON/OFF state determination part determines whether or not the switching element is turned on based on the switching current which is detected by the switching current detection part,
the memory part, when the ON/OFF state determination part determines that the switching element is brought into an ON state, stores the operation temperature of the switching element, and stores the control electrode voltage applied to the control electrode as a temperature characteristic measurement time threshold voltage of the switching element, and
the temperature characteristic calculation part calculates a temperature characteristic of a threshold voltage in the switching element based on information including the initial threshold voltage, an initial temperature of the switching element when the initial threshold voltage is measured, the operation temperature of the switching element detected by the temperature detection part in the temperature characteristic measurement mode, and the temperature characteristic measurement time threshold voltage.

8. The power module according to claim 1, wherein
the power module is a power module which further performs a temperature characteristic measurement mode where a temperature characteristic of a threshold voltage in the switching element is measured after the control mode is performed for a predetermined time,
the power module further comprises:
a threshold voltage measurement power source which supplies a threshold voltage measurement current to the first electrode of the switching element;
a switching current detection part which detects a switching current which flows through the switching element;
an ON/OFF state determination part which determines an ON/OFF state of the switching element; and
a temperature characteristic calculation part which calculates a temperature characteristic of a threshold voltage in the switching element, and in the temperature characteristic measurement mode,
the control electrode voltage control part controls the control electrode voltage such that the control electrode voltage is increased in a stepwise manner,
the ON/OFF state determination part determines whether or not the switching element is turned on based on the switching current which is detected by the switching current detection part,
the memory part, when the ON/OFF state determination part determines that the switching element is brought into an ON state, stores the control electrode voltage applied to the control electrode as a temperature characteristic measurement time threshold voltage of the switching element, and
the temperature characteristic calculation part calculates a temperature characteristic of a threshold voltage in the switching element based on information including the initial threshold voltage, an initial temperature of the switching element when the initial threshold voltage is measured, the operation temperature of the switching element detected by the temperature detection part in the temperature characteristic measurement mode, and the temperature characteristic measurement time threshold voltage.

9. The power module according to claim 1, wherein the switching element is a MOSFET, an IGBT, or a HEMT.

10. The power module according to claim 1, wherein the switching element comprises a material which contains GaN, SiC, or $Ga_2O_3$.

11. A power module, comprising:
a switching element having a first electrode, a second electrode, and a control electrode;
a temperature detection part which detects an operation temperature of the switching element;
a control electrode voltage control part which controls a control electrode voltage based on a threshold voltage during an operation of the switching element which is calculated based on information including the operation temperature of the switching element;
a switching speed control part which controls a switching speed of the switching element based on the operation temperature of the switching element; and
a switching speed calculation part which calculates a control electrode current amount based on the operation temperature of the switching element detected by the temperature detection part, wherein
the switching speed control part includes:
a first control drive current control part which controls a first control drive current flowing into the switching element based on the control electrode current amount which is calculated by the switching speed calculation part and the control electrode voltage which the control electrode voltage control part controls; and
a second control drive current control part which controls a second control drive current flowing into a ground side from the switching element based on the control electrode current amount which is calculated by the switching speed calculation part and a control electrode voltage which the control electrode voltage control part controls.

12. The power module according to claim 11, wherein the first control drive current control part allows a first control drive current corresponding to a first reference voltage which is calculated based on the control electrode current amount to flow toward the switching element, and the second control drive current control part allows a second control drive current corresponding to a second reference voltage which is calculated based on the control electrode current amount to flow toward a ground side from the switching element.

13. The power module according to claim 12, wherein the first control drive current control part includes:
a first current mirror circuit of one stage or a plurality of stages into which the first control drive current flows, and
a first error amplifier circuit which detects a first drive current at an input side of the first current mirror circuit and generates a first drive voltage corresponding to the first drive current, and changes the first drive current by making the first drive voltage follow the first reference voltage, and
the second control drive current control part includes:
a second current mirror circuit of one stage or a plurality of stages into which the second control drive current flows, and
a second error amplifier circuit which detects a second drive current at an input side of the second current mirror circuit and generates a second drive voltage corresponding to the second drive current, and changes the second drive current by making the second drive voltage follow the second reference voltage.

14. The power module according to claim 11, wherein the power module is a power module which performs an initial threshold voltage measurement mode where the initial threshold voltage of the switching element is measured, and a control mode where an ON/OFF operation of the switching element is controlled,
the power module further comprises:
a threshold voltage measurement power source which supplies a threshold voltage measurement current to the first electrode of the switching element;
a switching current detection part which detects a switching current which flows through the switching element; and
an ON/OFF state determination part which determines an ON/OFF state of the switching element, and
in the initial threshold voltage measurement mode,
the control electrode voltage control part controls the control electrode voltage such that the control electrode voltage is increased in a stepwise manner,
the ON/OFF state determination part determines whether or not the switching element is turned on base on the switching current which is detected by the switching current detection part, and
the memory part, when the ON/OFF state determination part determines that the switching element is brought into an ON state, stores the operation temperature of the switching element, and stores the control electrode voltage applied to the control electrode as the initial threshold voltage of the switching element.

15. The power module according to claim 14, wherein the power module is a power module which further performs a temperature characteristic measurement mode where a temperature characteristic of a threshold voltage in the switching element is measured after the control mode is performed for a predetermined time,
the power module further comprises a temperature characteristic calculation part which calculates a temperature characteristic of a threshold voltage in the switching element, and in the temperature characteristic measurement mode,
  the control electrode voltage control part controls the control electrode voltage such that the control electrode voltage is increased in a stepwise manner,
  the ON/OFF state determination part determines whether or not the switching element is turned on based on the switching current which is detected by the switching current detection part,
  the memory part, when the ON/OFF state determination part determines that the switching element is brought into an ON state, stores the operation temperature of the switching element, and stores the control electrode voltage applied to the control electrode as a temperature characteristic measurement time threshold voltage of the switching element, and
  the temperature characteristic calculation part calculates a temperature characteristic of a threshold voltage in the switching element based on information including the initial threshold voltage, an initial temperature of the switching element when the initial threshold voltage is measured, the operation temperature of the switching element detected by the temperature detection part in the temperature characteristic measurement mode, and the temperature characteristic measurement time threshold voltage.

16. The power module according to claim 11, wherein
the power module is a power module which further performs a temperature characteristic measurement mode where a temperature characteristic of a threshold voltage in the switching element is measured after the control mode is performed for a predetermined time,
the power module further comprises:
  a threshold voltage measurement power source which supplies a threshold voltage measurement current to the first electrode of the switching element;
  a switching current detection part which detects a switching current which flows through the switching element;
  an ON/OFF state determination part which determines an ON/OFF state of the switching element; and
  a temperature characteristic calculation part which calculates a temperature characteristic of a threshold voltage in the switching element, and
in the temperature characteristic measurement mode,
  the control electrode voltage control part controls the control electrode voltage such that the control electrode voltage is increased in a stepwise manner,
  the ON/OFF state determination part determines whether or not the switching element is turned on based on the switching current which is detected by the switching current detection part,
  the memory part, when the ON/OFF state determination part determines that the switching element is brought into an ON state, stores the control electrode voltage applied to the control electrode as a temperature characteristic measurement time threshold voltage of the switching element, and
  the temperature characteristic calculation part calculates a temperature characteristic of a threshold voltage in the switching element based on information including the initial threshold voltage, an initial temperature of the switching element when the initial threshold voltage is measured, the operation temperature of the switching element detected by the temperature detection part in the temperature characteristic measurement mode, and the temperature characteristic measurement time threshold voltage.

17. The power module according to claim 11, wherein the switching element is a MOSFET, an IGBT, or a HEMT.

18. The power module according to claim 11, wherein the switching element comprises a material which contains GaN, SiC, or $Ga_2O_3$.

19. A power module, comprising:
  a switching element having a first electrode, a second electrode, and a control electrode;
  a temperature detection part which detects an operation temperature of the switching element;
  a control electrode voltage control part which controls a control electrode voltage based on a threshold voltage during an operation of the switching element which is calculated based on information including the operation temperature of the switching element; and
  a switching speed control part which controls a switching speed of the switching element based on the operation temperature of the switching element, wherein
the power module is a power module which performs an initial threshold voltage measurement mode where the initial threshold voltage of the switching element is measured, and a control mode where an ON/OFF operation of the switching element is controlled,
the power module further comprises:
  a threshold voltage measurement power source which supplies a threshold voltage measurement current to the first electrode of the switching element;
  a switching current detection part which detects a switching current which flows through the switching element; and
  an ON/OFF state determination part which determines an ON/OFF state of the switching element, and
in the initial threshold voltage measurement mode,
  the control electrode voltage control part controls the control electrode voltage such that the control electrode voltage is increased in a stepwise manner,
  the ON/OFF state determination part determines whether or not the switching element is turned on base on the switching current which is detected by the switching current detection part, and
  the memory part, when the ON/OFF state determination part determines that the switching element is brought into an ON state, stores the operation temperature of the switching element, and stores the control electrode voltage applied to the control electrode as the initial threshold voltage of the switching element.

20. The power module according to claim 19, wherein
the power module is a power module which further performs a temperature characteristic measurement mode where a temperature characteristic of a threshold voltage in the switching element is measured after the control mode is performed for a predetermined time,
the power module further comprises a temperature characteristic calculation part which calculates a temperature characteristic of a threshold voltage in the switching element, and
in the temperature characteristic measurement mode,
  the control electrode voltage control part controls the control electrode voltage such that the control electrode voltage is increased in a stepwise manner,
  the ON/OFF state determination part determines whether or not the switching element is turned on based on the switching current which is detected by the switching current detection part,
  the memory part, when the ON/OFF state determination part determines that the switching element is brought into an ON state, stores the operation temperature of the switching element, and stores the control electrode voltage applied to the control electrode as a temperature characteristic measurement time threshold voltage of the switching element, and the temperature characteristic calculation part calculates a temperature characteristic of a threshold voltage in the switching element based on information including the initial threshold voltage, an initial temperature of the switching element when the initial threshold voltage is measured, the operation temperature of the switching element detected by the temperature detection part in the temperature characteristic measurement mode, and the temperature characteristic measurement time threshold voltage.

21. The power module according to claim 19, wherein the switching element is a MOSFET, an IGBT, or a HEMT.

22. The power module according to claim 19, wherein the switching element comprises a material which contains GaN, SiC, or $Ga_2O_3$.

23. A power module, comprising:
a switching element having a first electrode, a second electrode, and a control electrode;
a temperature detection part which detects an operation temperature of the switching element;
a control electrode voltage control part which controls a control electrode voltage based on a threshold voltage during an operation of the switching element which is calculated based on information including the operation temperature of the switching element; and
a switching speed control part which controls a switching speed of the switching element based on the operation temperature of the switching element, wherein
the power module is a power module which further performs a temperature characteristic measurement mode where a temperature characteristic of a threshold voltage in the switching element is measured after the control mode is performed for a predetermined time, the power module further comprises:
a threshold voltage measurement power source which supplies a threshold voltage measurement current to the first electrode of the switching element;
a switching current detection part which detects a switching current which flows through the switching element;
an ON/OFF state determination part which determines an ON/OFF state of the switching element; and
a temperature characteristic calculation part which calculates a temperature characteristic of a threshold voltage in the switching element, and
in the temperature characteristic measurement mode,
the control electrode voltage control part controls the control electrode voltage such that the control electrode voltage is increased in a stepwise manner,
the ON/OFF state determination part determines whether or not the switching element is turned on based on the switching current which is detected by the switching current detection part,
the memory part, when the ON/OFF state determination part determines that the switching element is brought into an ON state, stores the control electrode voltage applied to the control electrode as a temperature characteristic measurement time threshold voltage of the switching element, and
the temperature characteristic calculation part calculates a temperature characteristic of a threshold voltage in the switching element based on information including the initial threshold voltage, an initial temperature of the switching element when the initial threshold voltage is measured, the operation temperature of the switching element detected by the temperature detection part in the temperature characteristic measurement mode, and the temperature characteristic measurement time threshold voltage.

24. The power module according to claim 23, wherein the switching element is a MOSFET, an IGBT, or a HEMT.

25. The power module according to claim 23, wherein the switching element comprises a material which contains GaN, SiC, or $Ga_2O_3$.

* * * * *